(12) United States Patent
Ohlinger et al.

(10) Patent No.: US 7,954,874 B2
(45) Date of Patent: Jun. 7, 2011

(54) PLASTIC SKIN WITH SWITCHING FUNCTION

(75) Inventors: Rainer Ohlinger, Sinzheim (DE); Roland Wolff, Seelze (DE); Karl Buchkremer, Burgwedel (DE)

(73) Assignee: Benecke-Kaliko AG, Hannover (DE)

( * ) Notice: Subject to any disclaimer, the term of this patent is extended or adjusted under 35 U.S.C. 154(b) by 17 days.

(21) Appl. No.: 12/186,091

(22) Filed: Aug. 5, 2008

(65) Prior Publication Data
US 2008/0290683 A1 Nov. 27, 2008

Related U.S. Application Data

(63) Continuation of application No. PCT/EP2006/069971, filed on Dec. 20, 2006.

(30) Foreign Application Priority Data

Feb. 21, 2006 (DE) .......................... 10 2006 008 385

(51) Int. Cl.
*B60R 7/06* (2006.01)
(52) U.S. Cl. ....... 296/70; 296/146.7; 296/153; 296/1.08
(58) Field of Classification Search .............. 296/146.7, 296/153, 70, 1.08
See application file for complete search history.

(56) References Cited

U.S. PATENT DOCUMENTS

| | | | | |
|---|---|---|---|---|
| 5,469,020 A | * | 11/1995 | Herrick | 313/511 |
| 5,952,630 A | * | 9/1999 | Filion et al. | 200/5 R |
| 6,371,548 B1 | | 4/2002 | Misaras | |
| 6,752,444 B2 | * | 6/2004 | Kitano et al. | 296/184.1 |
| 7,158,111 B1 | * | 1/2007 | Jackson et al. | 345/107 |
| 7,192,543 B2 | | 3/2007 | Malfliet et al. | |
| 2002/0101738 A1 | * | 8/2002 | Misaras | 362/487 |
| 2003/0051799 A1 | | 3/2003 | Stevenson et al. | |
| 2003/0081802 A1 | * | 5/2003 | Watanabe | 381/190 |
| 2003/0180498 A1 | | 9/2003 | De Winter et al. | |
| 2004/0195854 A1 | * | 10/2004 | Streit | 296/1.07 |
| 2005/0052426 A1 | | 3/2005 | Hagermoser et al. | |
| 2006/0284330 A1 | | 12/2006 | De Winter et al. | |
| 2007/0151835 A1 | | 7/2007 | Rakers et al. | |

FOREIGN PATENT DOCUMENTS

| | | |
|---|---|---|
| DE | 100 30 746 A1 | 1/2002 |
| DE | 103 52 044 A1 | 6/2005 |
| EP | 1 190 828 A1 | 3/2002 |
| EP | 1 248 369 A1 | 10/2002 |
| JP | 59-142113 A | 8/1984 |
| WO | 02/08003 A1 | 1/2002 |
| WO | 02/09977 A1 | 2/2002 |
| WO | 2004/069578 A2 | 8/2004 |
| WO | 2004/078518 A1 | 9/2004 |
| WO | 2005/021230 A1 | 3/2005 |
| WO | 2005/025942 A2 | 3/2005 |

OTHER PUBLICATIONS

International Search Report, dated Mar. 28, 2007.

* cited by examiner

*Primary Examiner* — Joseph D Pape
(74) *Attorney, Agent, or Firm* — Laurence A. Greenberg; Werner H. Stemer; Ralph E. Locher

(57) ABSTRACT

A single-layer or multi-layer plastic skin is formed into a covering for coated objects, such as trim parts of a motor vehicle. Regions in the plastic skin include switching, sensor, or transmission functionality.

8 Claims, 1 Drawing Sheet

PLASTIC SKIN WITH SWITCHING FUNCTION

CROSS-REFERENCE TO RELATED APPLICATIONS

This is a continuation under 35 U.S.C. §120, of copending international application PCT/EP2006/069971, filed Dec. 20, 2006, which designated the United States; this application also claims the priority, under 35 U.S.C. §119, of German patent application DE 10 2006 008 385.7, filed Feb. 21, 2006; the prior applications are herewith incorporated by reference in their entirety.

BACKGROUND OF THE INVENTION

1. Field of the Invention

The invention relates to a single-layer or multi-layer plastic skin as a surface covering for coated objects. Similarly, particularly suitable methods for producing such a plastic skin are disclosed, and also a trim part coated with such a plastic skin for the passenger compartment of a motor vehicle.

Grained, patterned or finely structured plastic skins forming surfaces for objects are also known and are used for example for the interior trim in vehicles, often in the form of relatively soft, underfoamed films with a pleasing feel, for instance for the trim of dashboards or the inner shells of doors, etc. With appropriate adaptation in terms of strength and design, such films are of course also used for other articles that are provided with a high-quality coating.

There are various methods known in the prior art for producing such plastic skins, for example rolling and/or embossing methods for producing "endless" film webs of thermoplastic material, or methods for producing individual ready-from-the-mold molded skins, that is to say plastic moldings.

In the case of the rolling and embossing methods, an embossing roller is used to provide a thermoplastic film in the form of a web with a three-dimensionally structured, embossed surface, that is to say for instance a grained "leather surface."

Ready-from-the-mold molded skins in this context refer to more or less rigid plastic moldings that are produced in molds by various sintering or spraying processes, for example, and in the case of which one or more liquid or powdered components are introduced into a mold and react/cure there. Ready-from-the-mold molded skins are consequently also created by rotational sintering, for example by methods for producing so-called slush skins.

In the case of these ready-from-the-mold methods there is also the possibility of fixing the surface structure/texture, i.e. the surface of the plastic skin, that is to say for instance the appearance of a grain effect, and the geometry of the entire component in a single molding process during production. For this purpose, for example, the grained structure and component geometry are introduced as a negative into a mold, the plastic skin is shaped by sintering or spraying processes and then the said skin is removed.

Both the web material and the molded skins are generally provided on the rear side with a layer of plastic foam, either after the embossing and/or after bringing and thermoforming them into the component mold (web material) or already in the mold in which the plastic skin was produced (molded skin). Of course, other methods of foam coating, such as for instance brushing methods, are known. By this subsequent "foam backing," an already quite rigid three-dimensionally shaped component is obtained. Foam backing here represents only one possible way of forming a support structure for the plastic skin. Also known for instance is the adhesive attachment of supporting structural elements made of hard plastic.

European published patent application EP 1 190 828 A1 and its counterpart U.S. Pat. No. 7,192,543 B2 describe a method for producing ready-from-the-mold melted/molded articles, such as for instance dashboards, door panels or glove compartments, in which a divided lower mold is first, and at least partially, lined with a flexible film, which covers over the seams that are present in the mold, and which has on its inner side a grain effect, for example a leather texture. A reactive mixture is sprayed onto the flexible film and then forms the outer skin of the component, before further reinforcements or layers of foam are applied by various spraying or melting-molding methods.

After the production process, the molded skins with the support structure are usually given a clean finish, i.e. any edges of skin there may be are cut off and, in the case of dashboards, for example, the necessary clearances or holes for instruments, switches, decorative strips, radios, etc. are produced. After that, for example, all the switches and signaling elements are individually fitted into the dashboard and wired or provided with connecting lines, which can then be connected when they are installed in the vehicle. The same applies to the installation of instruments, lighting means, loudspeakers, and the like. Decorative strips and mountings must likewise also be attached.

Altogether, therefore, considerable effort, a series of time-consuming and cost-intensive production steps and logistical planning are still required before a ready-to-install dashboard, a door insert or similar components with functional elements are passed on to the plant carrying out further processing, here that is to the vehicle manufacturer.

SUMMARY OF THE INVENTION

It is accordingly an object of the invention to provide a plastic skin with switching function which overcomes the above-mentioned disadvantages of the heretofore-known devices and methods of this general type and which provides for a plastic skin which on the one hand reduces such complex further processing steps as much as possible and on the other hand combines a high level of component integration with a pleasing appearance of the plastic skin.

With the foregoing and other objects in view there is provided, in accordance with the invention, a plastic skin surface covering for a coated object, comprising:

a single-layer or multi-layer plastic skin forming the surface covering for the coated object; and functional devices selected from the group consisting of devices having a switching function, a sensor function, or a signal transmission function integrated in regions of said plastic skin.

In other words, regions in which the plastic skin has a switching, sensor or signal transmission function are already arranged in the plastic skin. Such functional elements in the plastic skin obviate the necessity for the subsequent installation of the same in the form of separate switches or sensors, which in turn would have to be reliably connected to the plastic skin as individual elements and provided with a multiplicity of connecting cables. This is so because, in the case of the solution according to the invention, the leads or terminals can also be integrated in the plastic skin in the form of film strip conductors as signal transmission functions.

The regions of the plastic skin in which the plastic skin has such a switching, sensor or signal transmission function are advantageously arranged on the outer surface of the plastic skin. Consequently, they can be operated or reached from the outside, which of course is meaningful in particular for switching elements that are for example to be operated by the occupants of a vehicle. Sensor elements, such as temperature sensors or infrared sensors, may, but do not have to be, positioned on the surface of the plastic skin.

This similarly applies to a further advantageous development in which the switching, sensor or signal transmission elements are arranged within the plastic skin, preferably in the outer surface regions of the plastic skin. The difference between these developments and the configurations that the plastic skin itself does not have a "functional" region, that is to say for example a capacitively or inductively reactive region built up from multiple layers of partially conductive plastic, but contains individual, but integrated, elements which provide the said switching, sensor or signal transmission functions, that is to say for example electronic switching elements that are incorporated in the plastic skin and respond to pressure, temperature, etc., or for instance generate signals in the form of light, sounds, waves, vibrations, etc. Such switching, sensor or signal transmission elements are advantageously in the form of films, to be more precise in the form of electronic film-integrated circuits, which of course can then be integrated particularly easily in a thin plastic skin.

A further advantageous development consists in that signal transmission elements in the form of lighting means are arranged within the plastic skin, preferably as LED lighting means. For example in the case of a dashboard, this dispenses with the subsequent complex installation of dashboard lighting or glove compartment lighting.

The same applies to a further advantageous development which consists in that signal transmission elements in the form of loudspeakers are formed within the plastic skin. This is already possible with the simple flat loudspeakers such as those that are available for portable computers, though flexible or shape-adaptable flat emitters are of course even more suitable.

With the increasingly widespread use in vehicles of satellite-aided navigation equipment, which projects maps of the local area onto a screen, a further advantageous development consists in that signal transmission elements in the form of flat screens are formed within the plastic skin, preferably as screens in film form, which can then be used as a display for navigation equipment or else, with a corresponding TV control, as television screens.

Such elements as for instance flat emitters or flat screens integrated as signal transmission elements in plastic film are suitable in the same way for a dashboard of a passenger car as they are for corresponding furniture coatings in the case of furniture in a conference hall or a hotel lobby.

An advantageous development of such a plastic skin consists in that the plastic skin is formed as a rolled and/or embossed endless thermoplastic film. Such an endless film can then be easily provided with appropriate layers or elements to provide the switching, sensor or signal transmission regions before or after cutting to size for the subsequent thermoforming process in a component mold for example on what is later to be their outer side, facing the component mold.

A further advantageous development of such a plastic skin consists in that the plastic skin is formed as a ready-from-the-mold molded skin. In the case of such a molded skin, which is of course generally created within a mold by sintering, spraying or filling processes, functional regions can be introduced in a simple way.

This can take place for example in a particularly advantageous way by one or more liquid or powdered plastic components being introduced into a reaction mold and reacting or curing there. The skin created in this way is then foam-backed with a layer of plastic foam, preferably polyurethane foam, and optionally connected to a support frame. In a first preliminary method step, the switching, sensor or signal transmission elements are placed in the reaction mold and positioned there at a distance from the later surface of the plastic skin.

In this way, the functional elements are incorporated and integrated stably in dimensional terms in the plastic skin at the exactly predeterminable positions in an extremely simple manner, but can be connected to the corresponding connections in the vehicle by means of their terminal film strip conductors led out from the plastic skin body and are visually integrated outstandingly in the surface of the plastic skin.

The same advantages are offered by a further method for producing a The plastic skin surface covering according to the invention with functional regions existing directly in the plastic skin, that is to say for example a capacitively or inductively reactive region built up from multiple layers of partially conductive plastic. This method, in which one or more liquid or powdered plastic components are introduced into a reaction mold and react or cure there, in which the skin created in this way is then foam-backed with a layer of plastic foam, preferably polyurethane foam, and optionally connected to a support frame, consists in that, in a first method step, the switching, sensor or signal transmission elements are created by reaction layers and separating layers partially applied in the reaction mold, preferably in the form of differently conductive lacquers.

An advantageous development of the production methods consists in that powdered plastic components are introduced into a heated reaction mold and melted there in a sintering or slush-molding process, preferably by rotational sintering. The slow melting process of the finely powdered granules at elevated temperature during rotational sintering results in particularly secure inclusion in or secure fusion onto the functional elements or regions. In the case of this method, a polymer powder is generally located in the heated and rotating mold/reaction mold and then fuses on the heated parts of the walls of the mold.

The mold generally comprises an interchangeable lower mold box and an upper mold. The lower mold box, which in each case also contains the powder bed, is detachably arranged with respect to the upper mold. For producing plastic molded skins, the connected parts of the mold, i.e. the lower mold box and the upper mold, must then be turned about an axis of rotation. The lower mold box, filled with polymer powder, known as the "bucket," therefore joins in the rotation, so that the polymer powder trickles over the inner surface of the heated upper mold box, in order that the polymer powder fuses on the upper mold (reaction mold) during the rotational sintering and bonds in the switching, sensor or signal transmission elements during the fusing and curing.

The plastic skin according to the invention can be used particularly advantageously as a trim part for the passenger compartment of a vehicle, preferably as a dashboard, as also described on the basis of an exemplary embodiment for a ready-from-the-mold plastic skin, which the invention explains in more detail. Of course, such a plastic skin can also be used in an outstanding way as interior door paneling of a motor vehicle in which the switching elements for the window lifters and the exterior mirror are integrated in the plastic skin, or for aircraft seat and armrest trim in which switching elements for light, ventilation and service calling are integrated, etc.

Other features which are considered as characteristic for the invention are set forth in the appended claims.

Although the invention is illustrated and described herein as embodied in plastic skin with switching function, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DETAILED DESCRIPTION OF THE INVENTION

Figure 1:
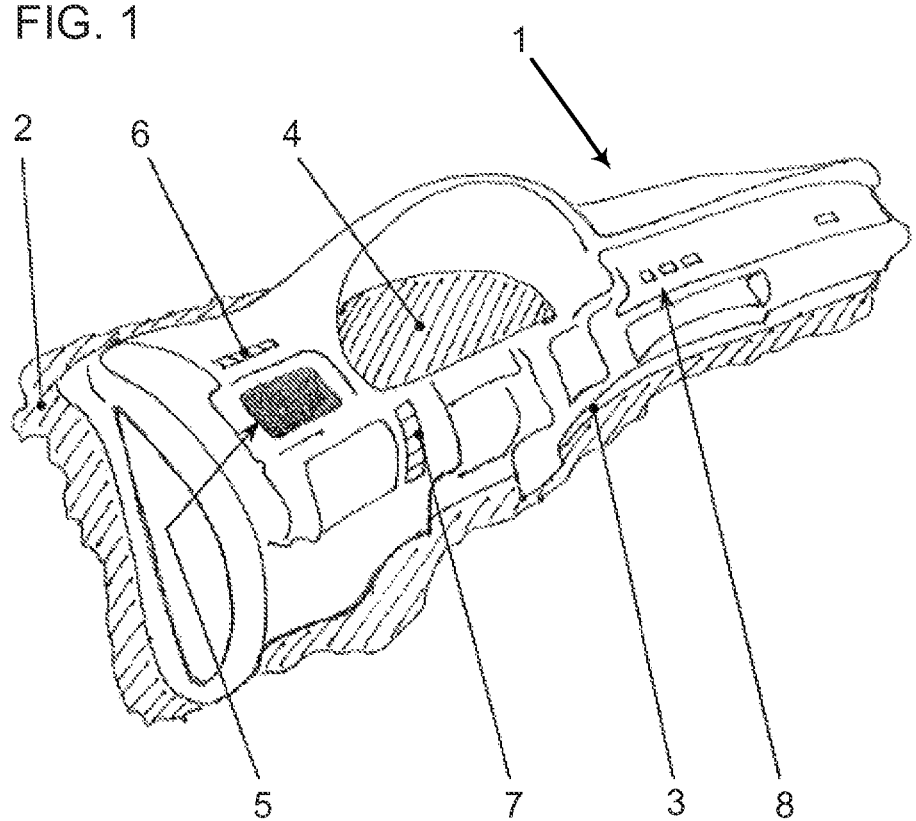
FIG. 1 is a perspective view of a dashboard of a passenger car with the molded skin covering and FIG. 2 is a perspective view of a dashboard of a passenger car with a flat screen display.

Referring now to FIG. 1 of the drawing in detail the invention may be implemented as a molded skin 1 produced in a rotational sintering process, namely as a so-called slush skin for a dashboard of a passenger car, as removed from the melting or reaction mold, i.e. from the upper mold, after the production method according to the invention. The contour of the dashboard is in this case already clearly defined, so that the molded skin can be readily applied to a correspondingly formed stiffening substructure, a so-called support.

The shaded regions 2, 3 of the molded skin represent excess molded edges, which are removed during finishing. The shaded region 4 is likewise cut out during finishing and then forms the clearance for the display instruments to be inserted later.

Functional devices, such as switching, sensor or signal transmission elements 5, 6, 7 and 8, namely a flat-emitting loudspeaker 5, associated switches for balance, volume, etc., grouped together in the switch strip 6, and also switching elements 7 for operating the headlamp height adjustment, and LED lighting means 8, later intended to serve as a passenger reading light, are arranged such that they are integrated and fused into the outer surface regions of the molded skin. These elements are the first to be placed in the reaction mold, i.e. in the upper mold of a mold for the rotational sintering process, and are positioned there in such a way that they terminate with the surface of the molded skin. The switching elements 6 and 7 are so-called film switches, which react to the changing of an electric field that occurs when they are touched. Even if not specifically shown here—all the connections to the elements 5, 6, 7 and 8 are already led up to the rear side of the molded skin as film strip conductors and can be directly connected to the electrical system of the motor vehicle when the dashboard is installed.

Figure 2:
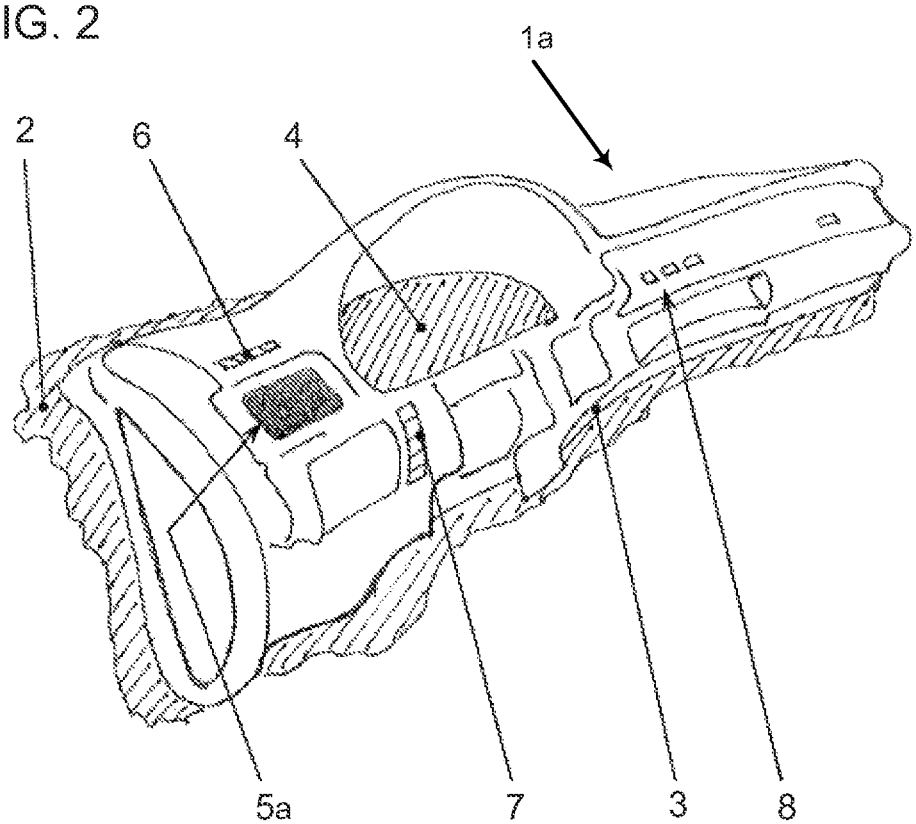

FIG. 2 shows another embodiment of the molded plastic skin 1a for the dashboard of a passenger car. However, in this embodiment, a flat screen display 5a is formed within the plastic skin 1a.

The invention claimed is:

1. A motor vehicle part, comprising:
   a dashboard of a motor vehicle, said dashboard having a surface; and
   a plastic skin forming said surface of said dashboard; and
   said plastic skin including at least one region with a functional device formed therein, said functional device selected from the group consisting of a loudspeaker, a flat screen display, and a lighting device.

2. The plastic skin surface covering according to claim 1, wherein said plastic skin includes an additional region with an additional functional device formed therein, said additional functional device selected from the group consisting of switching elements and sensor elements.

3. The plastic skin surface covering according to claim 2, wherein said additional functional device is a film element.

4. The plastic skin surface covering according to claim 1, wherein said functional device is said lighting means.

5. The plastic skin surface covering according to claim 4, wherein said lighting means are LED lights.

6. The plastic skin surface covering according to claim 1, wherein said functional device is said flat screen display, and said flat screen display is a film screen formed within said plastic skin.

7. The plastic skin surface covering according to claim 1, wherein said functional device is said loudspeaker.

8. The plastic skin surface covering according to claim 1, wherein said functional device is said flat screen display.

* * * * *